United States Patent
Ishikawa (10) Patent No.: US 6,294,446 B1
(45) Date of Patent: Sep. 25, 2001

(54) METHODS OF MANUFACTURING A HIGH ELECTRON MOBILITY TRANSISTOR WITH A T-SHAPED GATE ELECTRODE

(75) Inventor: Yamato Ishikawa, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/576,646

(22) Filed: May 22, 2000

Related U.S. Application Data (62) Division of application No. 08/829,130, filed on Mar. 28, 1997, now abandoned.

(30) Foreign Application Priority Data

Apr. 4, 1996 (JP) .................................................. 8-108392

(51) Int. Cl.$^7$ .................................................. H01L 21/28
(52) U.S. Cl. .................... 438/579; 438/574; 438/605; 438/606; 438/167; 438/172
(58) Field of Search .................... 438/172, 167, 438/745, 518, 572–574, 576, 579, 604–606; 257/192, 194

(56) References Cited

U.S. PATENT DOCUMENTS

| | | | |
|---|---|---|---|
| 5,496,748 | 3/1996 | Hattori | 437/40 |
| 5,504,353 | 4/1996 | Kuzuhara | 257/194 |
| 5,538,910 | 7/1996 | Oku | 437/39 |
| 5,557,126 | 9/1996 | Cunningham | 257/332 |
| 5,668,387 | 9/1997 | Streit et al. | 257/192 |
| 5,677,553 | * 10/1997 | Yamamoto et al. | |
| 5,717,232 | * 2/1998 | Inoue et al. | |
| 5,770,525 | * 6/1998 | Kamiyama | |
| 5,811,843 | * 9/1998 | Yamamoto et al. | |
| 5,874,753 | * 2/1999 | Hayafuji et al. | |

FOREIGN PATENT DOCUMENTS

| | | |
|---|---|---|
| 01-090563 | 4/1989 | (JP) . |
| 05-063006 | 3/1993 | (JP) . |
| 05-121445 | 5/1993 | (JP) . |
| WO 88/02927 | 4/1988 | (WO) . |

\* cited by examiner

*Primary Examiner*—Charles Bowers
*Assistant Examiner*—Stephen W. Smoot
(74) *Attorney, Agent, or Firm*—Lyon & Lyon LLP

(57) ABSTRACT

A high electron mobility transistor includes a channel layer for developing therein an electron gas layer having a substantially uniform electron gas density, and upper and lower high-resistance wide-band gap layers disposed respective over and beneath the channel layer, each of the upper and lower high-resistance wide-band gap layers having a silicon-doped planar layer disposed therein. A contact layer is disposed on the upper wide-band gap layer for contact with source and drain electrodes, the contact layer having a recess defined therein which divides the contact tact layer. A gate electrode of substantially T-shaped cross section is disposed in the recess, and a passivation film is disposed on an inner wall surface of the recess and a lower leg portion of the gate electrode, exposing an upper head portion of the gate electrode.

15 Claims, 7 Drawing Sheets

METHODS OF MANUFACTURING A HIGH ELECTRON MOBILITY TRANSISTOR WITH A T-SHAPED GATE ELECTRODE

This application is a divisional application of co-pending application Ser. No. 08/829,130, filed on Mar. 28, 1997, now abandoned.

BACKGROUND OF THE INVENTION

1. Field of the Invention

The present invention relates to a high electron mobility transistor for use in a radio-frequency amplifier which operates in a millimeter wave band, and a method of manufacturing such a high electron mobility transistor and a field-effect transistor.

2. Description of the Prior Art

There has been developed a high electron mobility transistor which has a channel layer of high electron mobility (aluminum gallium arsenide) for improved radio-frequency characteristics. In the developed high electron mobility transistor, a thin layer of InGaAs is formed intermediate in a wide-band gap layer of high-resistance AlGaAs (aluminum gallium arsenide), thereby producing a channel layer of double heterojunction structure. Electrons are supplied at a relatively high concentration into the channel layer from silicon-doped planar layers that are disposed respectively in upper and lower wide-band gap layer portions.

U.S. patent application Ser. No. 08/565,295 filed Nov. 30, 1995, entitled "FIELD-EFFECT TRANSISTOR" and assigned to the present assignee, discloses a high-performance high electron mobility transistor whose mutual conductance changes to a small degree with respect to a gate voltage. because the thickness of the channel layer is limited to a value small enough to regard an electron gas layer as a substantially single layer and the upper and lower wide-band gap layer portions of AlGaAs have a high resistance.

If the channel layer is thick, the electron gas layer formed in the channel layer is localized in the vicinity of the heterojunction plane, and hence separated into two layers whose depths from the transistor surface are different from each other, i.e., whose distances from the gate electrode are different from each other. The gate voltage has different effects on two electron (gas layers which are separated at different depths, i.e., spaced different distances from the gate electrode. As a consequence, the mutual conductance becomes largely dependent on the gate voltage.

According to the invention disclosed in U.S. patent application Ser. No. 08/565295 referred to above, the thickness of the channel layer is limited to a value small enough to regard an electron gas layer as a substantially single layer, specifically to a thickness in the range of from 50 Åto 150 Å, and the upper and lower layers of AlGaAs disposed adjacent to the thin channel layer have a high resistance. The upper and lower layers of AlGaAs above and below the thin channel layer have a high resistance because as the resistance of the upper and lower layers of AlGaAs increases, the gate voltage affects a wider area including the channel layer, resulting in the same effect as caused by.a reduction in the thickness of the channel layer.

Figure 1:
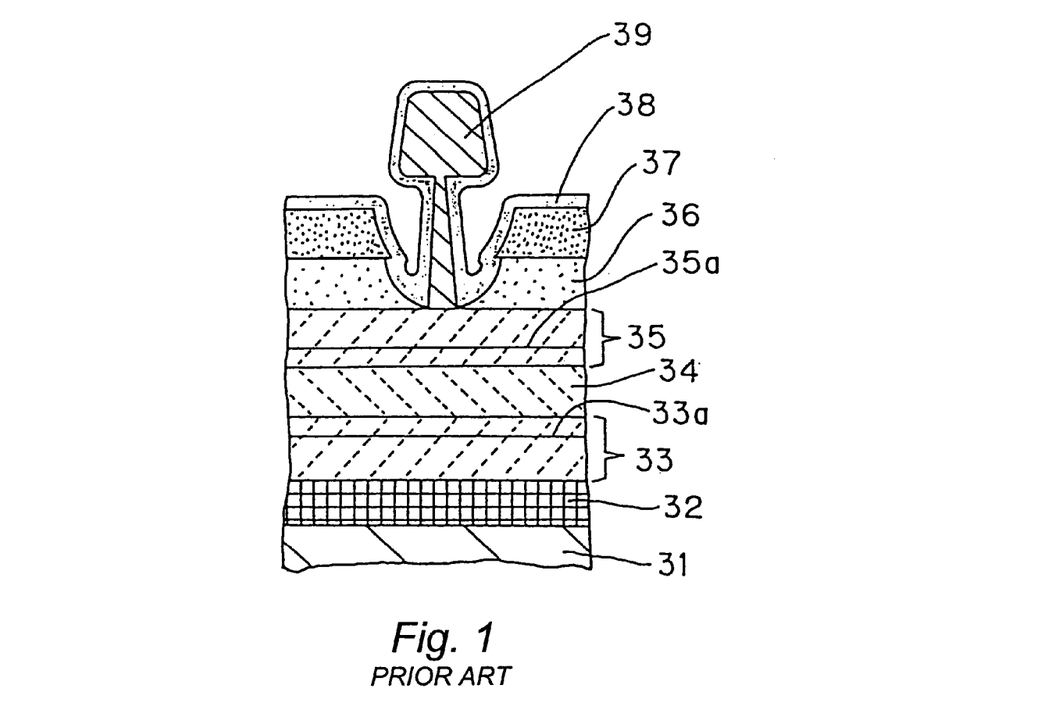
FIG. 1 is a fragmentary cross-sectional view of a high electron mobility transistor proposed in a prior application assigned to the present assignee.

FIG. 1 of the accompanying drawings schematically shows the structure of the high electron mobility transistor disclosed in U.S. patent application Ser. No. 08/565,295 referred to above. As shown in FIG. 1, the high electron mobility transistor has a semi-insulating GaAs substrate 31, a super-lattice buffer layer 32 disposed on the semi-insulating GaAs substrate 31 for preventing an unwanted carrier from leaking, a pair of lower and upper wide-band gap layers 33, 35 of AlGaAs disposed on the super-lattice buffer layer 32, an InGaAs channel layer 34 disposed between the lower and upper wide-band gap layers 33, 35, a pair of silicon-doped planar layers 33a, 35a disposed respectively in the lower and upper wide-band gap layers 33, 35, an n+GaAs contact layer 36 disposed on the upper wide-band gap layer 35, an $SiO_2$ film 37 disposed on the n+GaAs contact layer 365, a passivation film 38 disposed on the $SiO_2$ film 37, and a gate electrode 39 of T-shaped cross section disposed on the upper wide-band gap layer 35 and covered with the passivation film 38.

The channel layer 34 has a thickness which is selected to be of a value small enough to cause electron gases, which would otherwise be localized in the vicinity of heterojunctions formed between the channel layer 34 and the lower and upper wide-band gap layers 33, 35 and hence tend to be separated from each other, to be combined into a single electron gas layer that is controllable depending on changes in the gate electrode. Specifically, the thickness of the channel layer 34 is in the range of from 50 Å to 150 Å.

Figure 2:
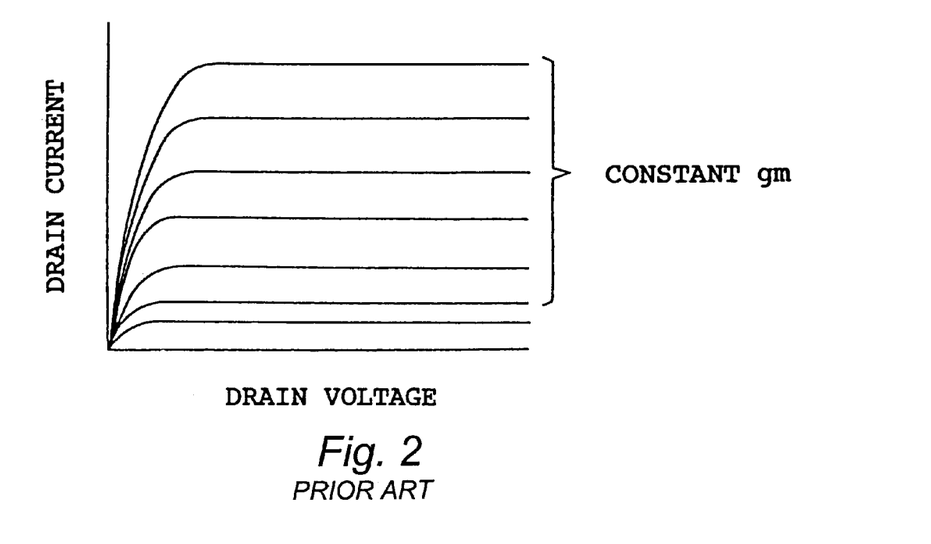
FIG. 2 is a graph showing experimental data on the relationship between the drain voltage and the drain current at various discrete values of the gate voltage of the high electron mobility transistor shown in FIG. 1.

FIG. 2 of the accompanying drawings shows experimental data on electric characteristics of the high electron mobility transistor shown in FIG. 1. The electric characteristics shown in FIG. 2 represent the relationship between the drain voltage and the drain current at various discrete values of the gate voltage. It can be seen from FIG. 2 that the drain current increases substantially uniformly as the gate voltage increases and the mutual conductance does not vary greatly depending on the gate electrode.

Figure 3:
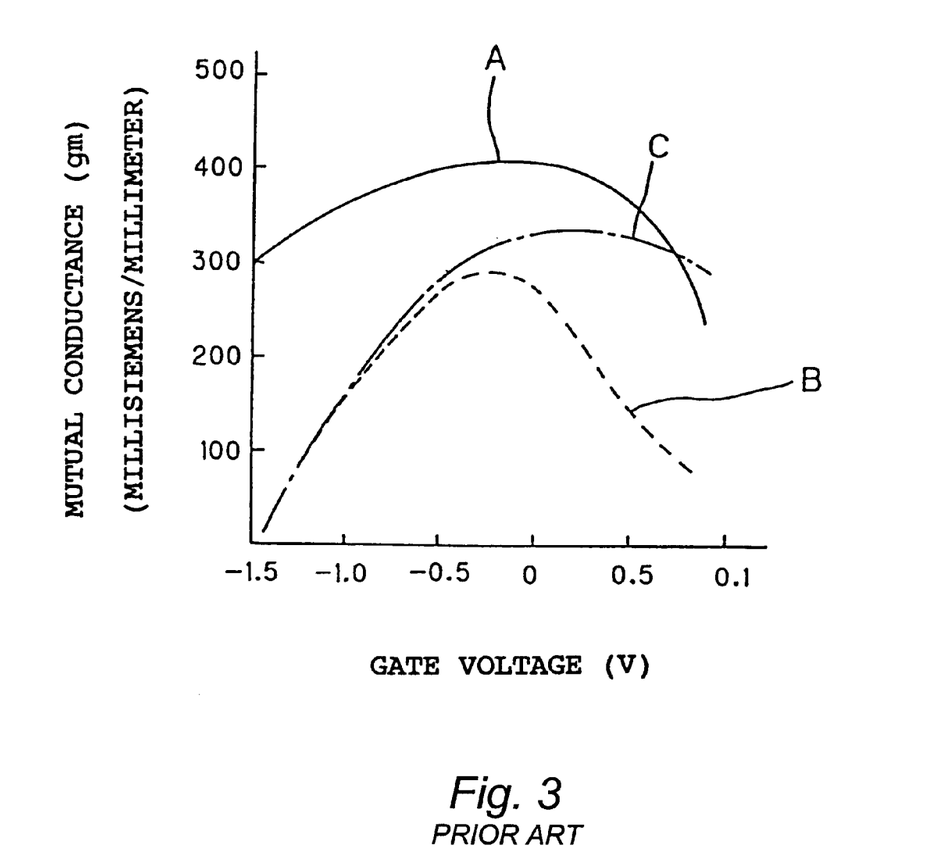
FIG. 3 is a graph showing experimental data on how the mutual conductances of the high electron mobility transistor shown in FIG. 1 and other conventional high electron mobility transistors vary depending on the gate voltage.

FIG. 3 of the accompanying drawings shows experimental data on the relationship between the mutual conductance and the gate voltage of the high electron mobility transistor or field-effect transistor (FET) shown in FIG. 1, a conventional high electron mobility transistor or FET, and an improved conventional high electron mobility transistor or FET. The graph shown in FIG. 3 has a vertical axis indicative of the mutual conductance (gm) per unit gate width and a horizontal axis indicative of the gate voltage (V). In FIG. 3, the solid-line curve A represents the experimental data of the high electron mobility transistor shown in FIG. 1, the broken-line curve B represents the experimental data of the conventional high electron mobility transistor, and the dot-and-dash-line curve C represents the experimental data of the improved conventional high electron mobility transistor. The experimental results illustrated in FIG. 3 clearly shows justifying support for the advantages of the, high electron mobility transistor disclosed in U.S. patent application Ser. No. 08/565,295.

U.S. patent application Ser. No. 08/558,548 filed Nov. 15, 1995 discloses a method of manufacturing a semiconductor device, which is suitable for the manufacture of the high electron mobility transistor shown in FIG. 1. According to the disclosed method, an etching solution suitable for a selective wet etching process for forming a recess in which a gate electrode will be formed comprises a mixture of ammonia water and hydrogen peroxide water mixed at a ratio of 1 to 4000 or more and diluted by water.

In the high electron mobility transistor shown in FIG. 1, the entire surface of the T-shaped gate electrode 39 is covered with the passivation film 38 . The passivation film 38 comprises an $SiO_2/N$ film or the like having a large dielectric constant which is several times the dielectric constant of air. Therefore, the parasitic capacitance of the gate electrode 39 is so large that the high electron mobility transistor has poor radio-freclluency characteristics.

SUMMARY OF THE INVENTION

It is therefore an object of the present invention to provide a high electron mobility transistor which has a low gate parasitic capacitance for improved radiofrequency characteristics.

To achieve the above object, there is provided in accordance with the present invention a high electron mobility transistor comprising a channel layer for developing therein an electron gas layer having a substantially uniform electron gas density, upper and lower high-resistance wide-band gap layers disposed respective over and beneath the channel layer, each of the upper and lower high-resistance wide-band gap layers having a silicon-doped planar layer disposed therein, a contact layer disposed on the upper wide-band gap layer for contact with source and drain electrodes, the contact layer having a recess defined therein which divides the contact layer, a gate electrode of substantially T-shaped cross section disposed in the recess, and a passivation film disposed on an inner wall surface of the recess and a lower portion of the gate electrode.

The high electron mobility transistor may further comprise a low-resistance wide-band geap layer disposed between the contact layer and the upper wide-band gap layer, the low-resistance wide-band gap layer being made of the same material as the upper wide-band gap layer.

The low-resistance wide-band gap layer may have an impurity concentration ranging from $3 \times 10^{17}$ cm$^{-3}$ to $3 \times 10^{18}$ cm$^{-3}$ and a thickness ranging from 40 Å to 120 Å.

The channel layer may have a thickness ranging from 50 Å to 150 Å.

The channel layer may be made of InGaAs, the upper and lower high-resistance wide-band gap layers may be made of AlGaAs, and the contact layer may be made of GaAs.

According to the present invention, there is also provided a method of manufacturing a high electron mobility transistor, comprising the steps of forming a high-resistance wide-band gap layer of AlGaAs on a channel layer of InGaAs, forming a low-resistance contact layer of GaAs on the high-resistance wide-band gap layer of AlGaAs, selectively etching the low-resistance contact layer of GaAs to define a recess which divides the low-resistance contact layer of GaAs, forming a wedge-shaped gate electrode extending vertically from a bottom of the recess by way of vacuum evaporation in the recess through an opening defined in a resist, forming a passivation film on an inner wall surface of the recess and a lower portion of the wedge-shaped gate electrode, and thereafter forming a gate electrode of a T-shaped cross section on the wedge-shaped gate electrode by way of vacuum evaporation through an opening defined in a resist.

The low-resistance contact Layer of GaAs may be selectively etched using an etching solution comprising a mixture of ammonia water and hydrogen peroxide water mixed at a ratio of 1 to 4000 or more and diluted by water.

According to the present intention, there is further provided a method of manufacturing a field-effect transistor, comprising the steps of forming a recess in a surface of a semiconductor crystal layer, forming a wedge-shaped gate electrode extending vertically from a bottom of the recess by way of vacuum evaporation in the recess through an opening defined in a resist, forming a passivation film on an inner wall surface of the recess and a lower portion of the wedge-shaped gate electrode, and thereafter forming a gate electrode of a T-shaped cross section on the wedge-shaped gate electrode by way of vacuum evaporation through an opening defined in a resist.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 4:
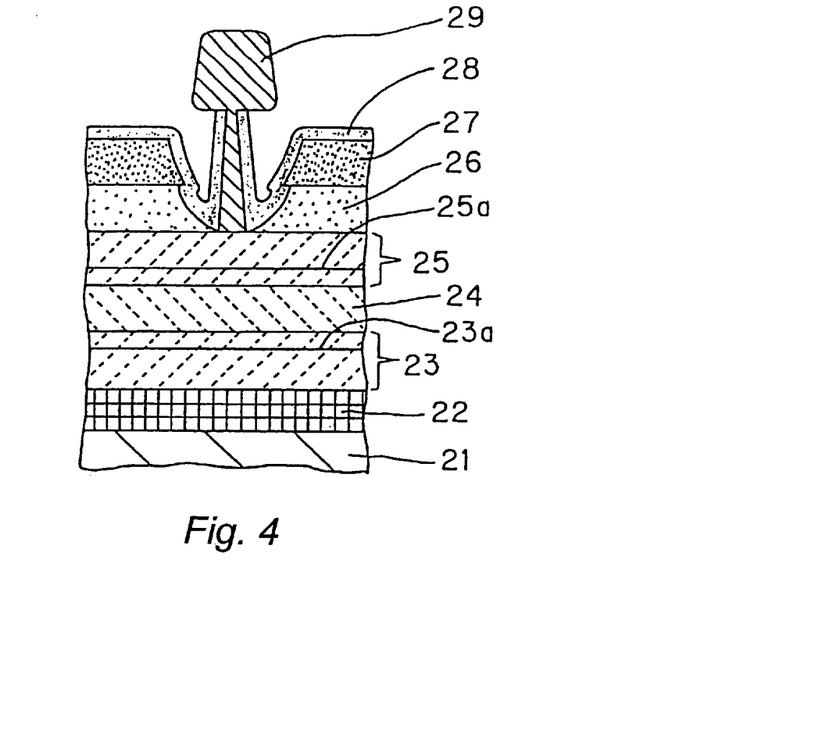
FIG. 4 is a fragmentary cross-sectional view of a high electron mobility transistor according to an embodiment of the present invention.

FIG. 4 shows in fragmentary, cross section a high electron mobility transistor according to an embodiment of the present invention.

As shown in FIG. 4, the high electron mobility transistor has a semi-insulating GaAs substrate 21, a superlattice buffer layer 22 disposed on the semi-insulating GaAs substrate 21 for preventing an unwanted carrier from leaking, a pair of lower and upper wide-bend gap layers 23, 25 of high-resistance AlGaAs disposed on the superlattice buffer layer 22, and an InGaAs channel layer 24 disposed between the lower and upper wide-band gap layers 23, 25. The InGaAs channel layer 24 and the lower and upper wide-band gap layers 23, 25 disposed below and above the InGaAs channel layer 24 jointly provide a double heterojunction structure. The high electron mobility transistor also includes an n$^+$GaAs contact layer 26 disposed on the upper wide-band gap layer 25. The n$^+$GaAs contact layer 26 has a thickness of about 500 Å and is formed by doping silicon (Si) at a high concentration of about $5 \times 10^{18}$ cm$^{-3}$. The high electron mobility transistor further includes an SiO$_2$ film 27 disposed on the n$^+$GaAs contact layer 265 and a passivation film 28 disposed on the SiO$_2$ film 27. The n$^+$GaAs contact layer 26 has a recess defined therein which separates the n$^+$GaAs contact layer 26 into a source side and a drain side. A gate electrode 29 of T-shaped cross section is disposed on the bottom of the recess.

The wide-band gap layer 23 disposed on the superlattice buffer layer 22 has a thickness of about 330 Å and is made of Al$_x$Ga$_{1-x}$As (0.2<x<0.3). The wide-band gap layer 23 includes a silicon-doped planar layer 23$a$ which contains an impurity of Si at an areal density of $2.5 \times 10^{12}$ and which is positioned at a location that is 30 Å spaced from the heterojunction between the wide-band gap layer 23 and the channel layer 24. The channel layer 24 has a thickness which is selected to be of a value small enough to cause electron gases, which would otherwise be localized in the vicinity of heterojunctions formed between the channel layer 24 and the lower and upper wide-band gap layers 23, 25 and hence tend to be separated from each other, to be combined into a single electron gas layer that is controllable depending on changes in the gate electrode. Specifically, the thickness of the channel layer 24 is in the range of from 50 Å to 150 Å.

The wide-band gap layer 25 disposed on the channel layer 24 also has a thickness of about 330 Å and is made of $Al_xGa_{1-x}As$ (0.2<x<0.3) The wide-band gap layer 25 also includes a silicon-doped planar layer 25a which contains an impurity of Si at an areal density of $2.5 \times 10^{12}$ and which is positioned at a location that is 30 Å spaced from the heterojunction between the wide-band gap layer 25 and the channel layer 24.

Therefore, the channel layer 24 and the wide-band gap layers 23, 25 are of a vertically symmetrical structure with respect to the horizontal central axis of the channel layer 24.

The passivation film 28 is deposited to cover only the $SiO_2$ film 27, the inner wall surface of the recess, and a lower leg portion of the T-shaped gate electrode 29, which are required to achieve minimum stable characteristics and electric insulation. The T-shaped gate electrode 29 has an upper head portion which is not covered with the passivation film 28. As a result, the T-shaped gate electrode 29 has a relatively small parasitic capacitance for improved radio-frequency characteristics.

The high electron mobility transistor shown in FIG. 4 is typically used as a normally-off field effect transistor because a depletion layer developed immediately below the gate electrode 29 normally spreads into the channel layer 24.

Figure 5:
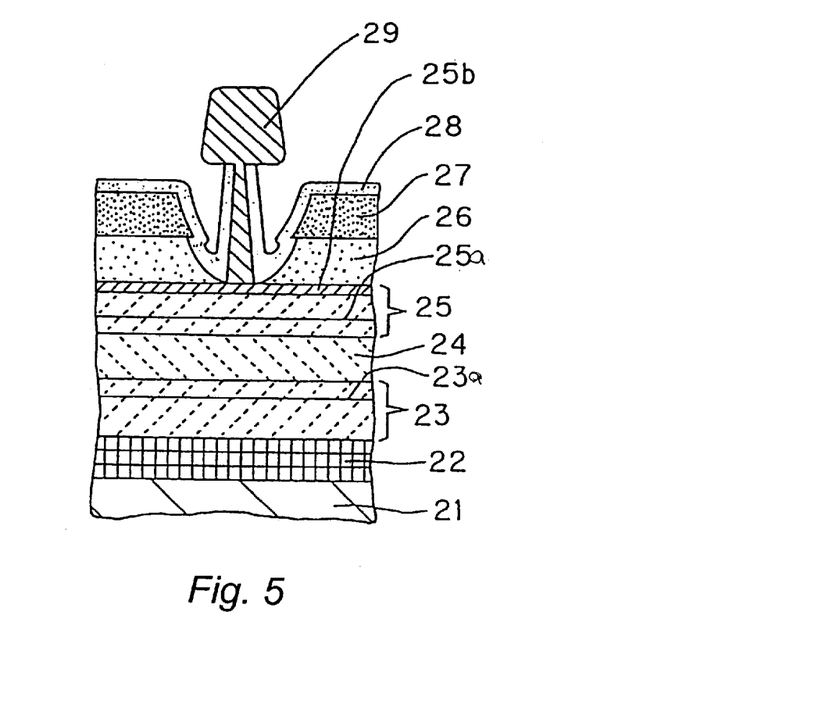
FIG. 5 is a fragmentary cross-sectional view of a high electron mobility transistor according to another embodiment of the present invention.

FIG. 5 shows in fragmentary cross section a high electron mobility transistor according to another embodiment of the present invention.

The high electron mobility transistor shown in FIG. 5 differs from the high electron mobility transistor shown in FIG. 4 in that it additionally includes a wide-band gap layer 25b of low-resistance AlGaAs disposed between the upper wide-band gap layer 25, which has a thickness of about 300 Å in the embodiment shown in FIG. 5, and the n⁺GaAs contact layer 26. The wide-band gap layer 25b has an impurity concentration ranging from $3 \times 10^{17}$ cm$^{-3}$ to $3 \times 10^{18}$ cm$^{-3}$ and a thickness ranging from 40 Å to 120 Å.

In order to lower the dependency of the mutual conductance on the gate voltage, the thickness of the channel layer 24 is limited to substantially uniformize the density of electron gases and also the resistance of the lower and upper wide-band gap layers 23, 25, at least the upper wide-band gap layer 25, adjacent to the channel layer 24 is increased. With the resistance of the lower and upper wide-band gap layers 23, 25 being increased, potential changes which occur at different depths in the channel layer 24 as the gate voltage varies to a certain extent, i.e., effects which the gate voltage has on the behavior of the electron gases, are close to each other.

With the upper wide-band gap layer 25 adjacent to the channel layer 24 being increased, a depletion layer developed immediately below the gate electrode 29 tends to reach the channel layer 24 even when the gate voltage is. low, making it difficult to keep the transistor turned normally on. Therefore, for designing a normally-on high electron mobility transistor, a low-resistance layer, i.e., the wide-band gap layer 25b, is formed on the surface of the wide-band gap layer to keep a spreading depletion layer idmmediately below the gate electrode 29 within the lowresistance layer 25b or the upper wide-band gap layer 25 for thereby preventing the gate voltage from affecting the channel layer 24.

Consequently, the high electron mobility transistor shown in FIG. 5 is typically used as a normally-on field effect transistor.

Since the wide-band gap layer 25b of low-resistance AlGaAs has a small thickness ranging from 40 Å to 120 Å, when the v oltage applied to the gat e electrode 29 varies greatly, a depletion layer developed immediately below the gate electrode 29 expands through the wide-band gap layer 25b of low-resistance AlGaAs and quickly spreads into the wide-band gap layer 25 of high-resistance AlGaAs, starting to affect the behavior of electron gases in the channel elayer 24.

FIGS. 6(A) through 6(L) show successive steps of a method of manufacturing a high electron mobility transistor according to the present invention. The method of manufacturing a high electron mobility transistor will be described below with reference to FIGS. 6(A) through 6(L).

Figure 6A:
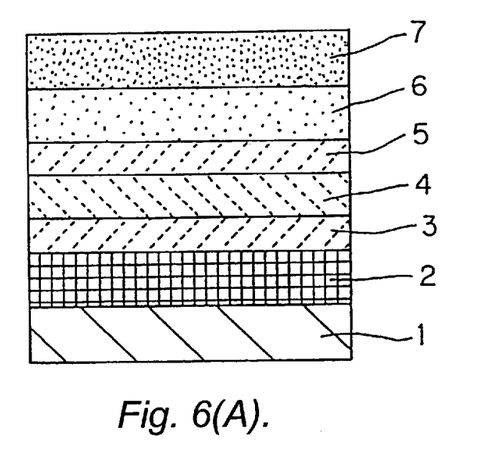
FIGS. 6(A) through 6(L) are fragmentary cross-sectional views showing successive steps of a method of manufacturing a high electron mobility transistor according to the present invention.

As shown in FIG. 6(A), a superlattice buffer 2 is deposited on a GaAs substrate 1, andlan double heterojunction structure comprising an $Al_xGa_{1-x}As$ layer 3 where the aluminum ratio x ranges from 0.2 to 0.3, an InGaAs channel layer 4 having a thickness of about 100 Å, and an AlGaAs layer 5 having a thickness of 300 Å is deposited on the superlattice buffer 2. An n⁺GaAs contact layer 6 having a thickness of 500 Å is deposited on the AlGaAs layer 5. Then, an $SiO_2$ film 7 having a thickness of 500 Å is deposited as an etching mask on the n⁺GaAs contact layer 6 by plasma CVD (chemical vapor deposition).

Figure 6B:
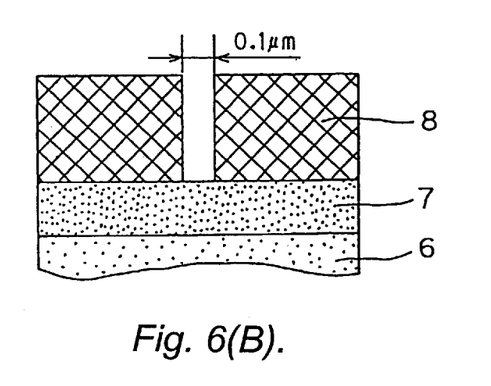

Then, as shown in FIG. 6(B), an electron beam resist 8 having a thickness of 3000 Å is deposited on the $SiO_2$ film 7. A pattern of an opening having a width of 0.1 μm is formed in the electron beam resist 8 by an electron beam lithography system and an image developing apparatus.

Figure 6C:
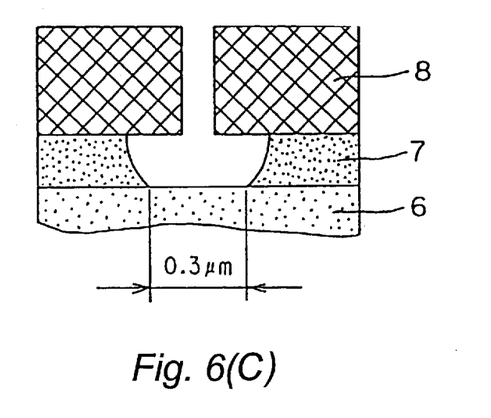

Thereafter, as shown in FIG. 6(C), the $SiO_2$ film 7 is etched by a wet etching process with the electron beam resist 8 used as a mask, producing in the $SiO_2$ film 7 a patterning layer having an opening whose lower end has a width of about 0.3 μm. The wet etching process uses an etching solution of BHF (buffered hydrofluoric acid; $HF:H_2O:NH_4F$ (=1:10:10). To allow the etching solution to fully enter the opening, it is preferable to treat the assembly with a surface-active agent prior to the wet etching process.

Figure 6D:
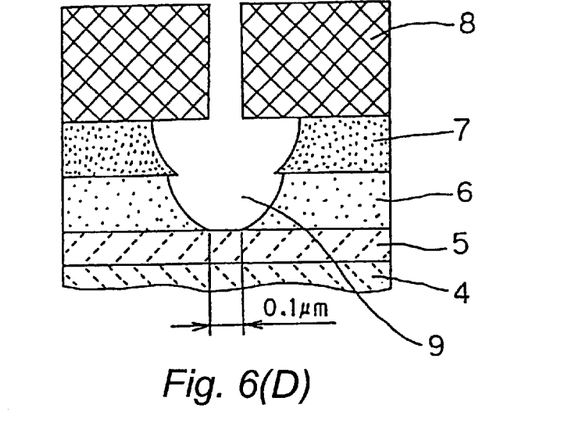

Then, as shown in FIG. 6(D), a recess is formed in the n⁺GaAs contact layer 6 by a selective etching process. In the selective etching process, the assembly is treated with a surface-active agent to allow an etching solution to enter the openings. Then, the n⁺GaAs contact layer 6 is selectively etched by an etching solution which comprises a mixture of ammonia water and hydrogen peroxide water mixed at a ratio of 1 to 4000 or more and diluted by water. As a result, a funnel-shaped recess 9 whose inside diameter smoothly decreases downwardly is formed in the n⁺GaAs contact layer 6 below the opening in the $SiO_2$ film 7. The amount of water which is added to dilute the mixture of the etching solution is varied to control the dilution and the etching time for thereby forming the recess 9 whose upper end has a width of about 0.3 μm and lower end has a width of about 0.1 μm. The etching solution preferably has a composition of $H_2O:H_2O_2:NH_4OH=53,300:8,000:1$, and the etching time required to etch the n⁺GaAs contact layer 6 which is 500 Å thick is 40 seconds.

As a result, the n⁺GaAs contact layer 6 is etched in a manner to minimize any exposure of an AlGaAs wide-band gap layer 5 which is formed between a gate electrode and an internal channel layer. The wide-bancd gap layer 5 is thus stabilized to reduce noise. The high electron mobility transistor or field-effect transistor has increased mutual conductance because resistances between the internal channel layer and source and drain electrodes on the surface are reduced.

Figure 6E:
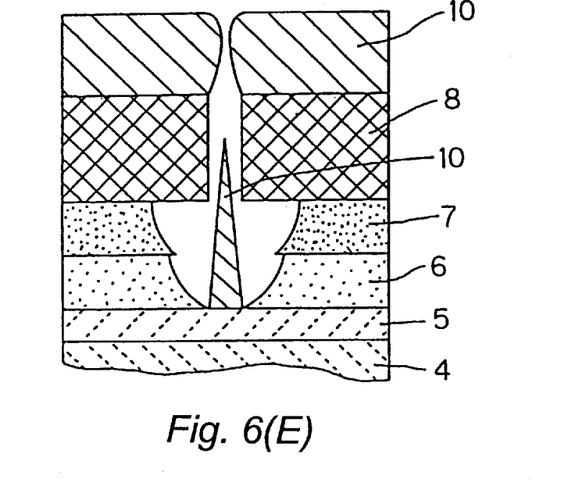
Figure 6F:
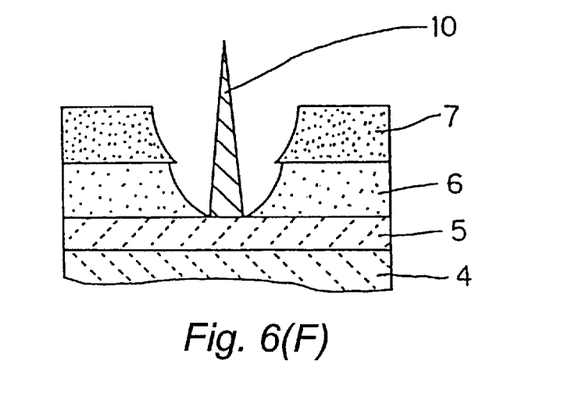

Thereafter, as shown in FIG. 6(E), using the electron beam resist 8 as a mask, a gate electrode 10 of Ti/Au having a wedge shape whose cross-.sectional shape is tapered off upwardly is formed using a resistance-heating vacuum evaporation apparatus. Since the gate electrode 10 is formed using the electron beam resist 8 as a mask, the width of the opening in the electrode beam resist 8 determines the length of the gate electrode 10. Then, the electron beam resist 8 is lifted off, together with a metal layer which has been deposited thereon to form the gate electrode 10, as shown in FIG. 6(F).

Figure 6G:
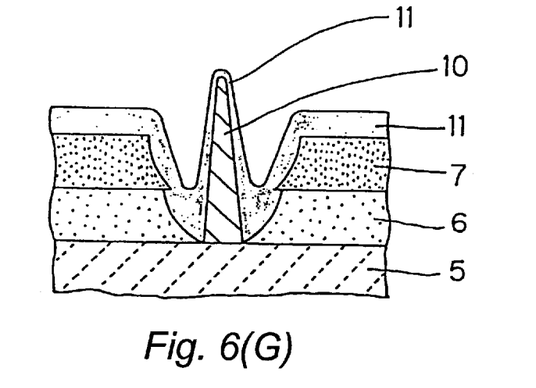
Figure 6H:
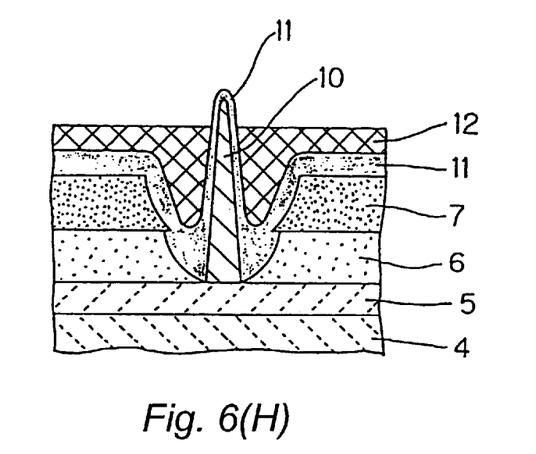
Figure 6I:
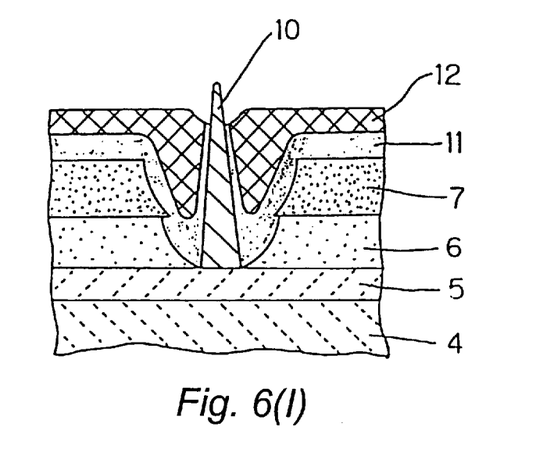

Then, an SiO/N layer is deposited on the entire surface formed thus far according to a CVD process, thereby forming a passivation film 11, as shown in FIG. 6(G). Then, as shown in FIG. 6(H), the passivation film 11 is coated on its entire surface with a resist film 12, followed by a plasma etching process to etch back the resist film 12 using a gas of $CF_4 + O_2$ or the like. As a result, only a tip end of the gate electrode 10 and a portion of the passivation film 11 which covers the tip end of the gate electrode 10 are exposed on the resist film 12. Thereafter, as shown in FIG. 6(I), the portion of the passivation film 11 which covers the tip end of the gate electrode 10 is removed by a wet etching process using an etching solution of BHF.

Figure 6J:
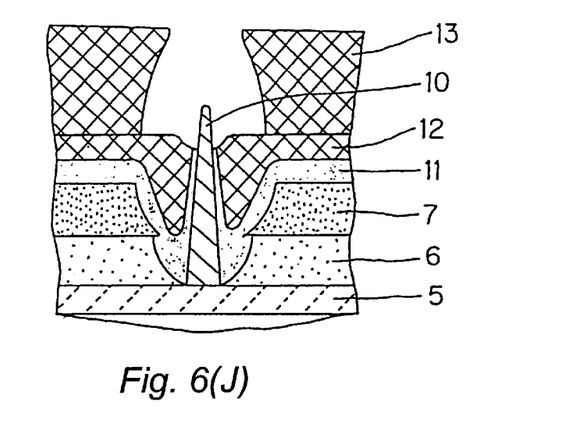
Figure 6K:
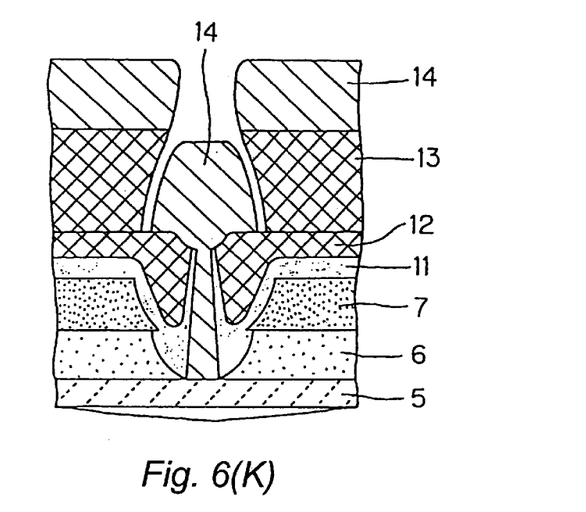

Then, as shown in FIG. 6(J), a new resist layer 13 is coated on the resist layer 12 by a coating process, and a lift-off resist pattern is formed on the resist layer 13 by exposure and development. Thereafter, as shown in FIG. 6(K), a gate metal layer 14 of Ti/Au is deposited by vacuum evaporation on the surface formed thus far, after which a whisker-shape projection on the gate metal layer 14 is removed using an etching solution of $KI + I_2 + H_2O$ (at a composition of 100:50:300) and HF ($HF:H_2O=1:100$).

Figure 6L:
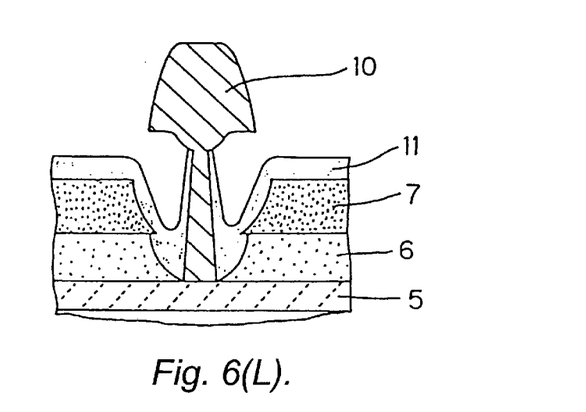

Finally, as shown in FIG. 6(L), the resist layer 13 is dissolved away by a chemical, together with the gate metal layer 14 deposited on the resist layer 13. Then, the resist layer 12 is also dissolved away by a chemical. As a consequence, there is produced a desired high electron mobility transistor in which the $SiO_2$ film 7, the inner wall surface of the recess, and a lower leg portion of the T-shaped gate electrode 10 are covered with the passivation film 11, exposing an upper head portion of the T-shaped gate electrode 10.

In the above embodiments, the resistance of the wide-band gap layers adjacent to the channel layer is high, and the thickness of the channel layer is small. However, the thickness of the channel layer may not be small, but only the resistance of the wide-band gap layers adjacent to the channel layer may be high to improve the mutual conductance of the high electron mobility transistor.

In the illustrated embodiments, the wide-band gap layers 23, 25 are made of AlGaAs, and the channel layer 24, as a narrow-band gap layer, is made of InGaAs. However, any combination of semiconductor crystals may be used which have the same relation as described above with respect to the widths of the band gaps (forbidden bands) or the magnitude of electron affinity.

Although certain preferred embodiments of the present invention have been shown and described in detail, it should be understood that various changes and modifications may be made therein without departing from the scope of the appended claims.

What is claimed is:

1. A method of manufacturing a field-effect transistor, comprising:

forming a recess in a surface of a semiconductor crystal layer;

forming a wedge-shaped body portion of a gate electrode extending vertically from a bottom of the recess;

forming a passivation film on an inner wall surface of the recess and a lower portion of the wedge-shaped gate electrode; and thereafter forming an enlarged head portion on the wedge-shaped gate electrode to provide a T-shaped gate electrode.

2. A method according to claim 1, wherein the step of forming a passivation film comprises:

forming a passivation film over an exposed surface of the entire wedge-shaped body portion and the semiconductor crystal layer; and selectively removing the passivation film from a tip portien of the wedge-shaped body portion.

3. The method of claim 2, wherein the step of selectively removing the passivation film from a tip portion of the wedge-shaped body portion comprises:

depositing a resist film over the passivation film such that the tip portion of the wedge-shaped body portion is exposed through the resist film; and removing the passivation film from the exposed tip portion of the wedge-shaped body portion.

4. A method of manufacturing a field-effect transistor, comprising the steps of:

forming a recess in a surface of a semiconductor crystal layer;

forming a wedge-shaped body portion of a gate electrode extending vertically from a bottom of said recess by way of vacuum evaporation in said recess through an opening defined in a resist;

forming a passivation film on an inner wall surface of said recess and a lower portion of said wedge-shaped body portion; and thereafter forming an enlarged head portion on said wedt, e-shaped body portion by way of vacuum evaporation through an opening in a resist to provide a gate electrode of a T-shaped cross section.

5. A method according to claim 4, wherein the step of forming a passivation film comprises:

forming a passivation film over an exposed surface of the wedge-shaped body portion and the semiconductor crystal layer; and selectively removing the passivation film from a tip portion of the wedge-shaped body portion.

6. The method of claim 5, wherein the step of selectively removing the passivation film from a tip portion of the wedge-shaped body portion comprises:

depositing a resist film over the passivation film such that the tip portion of the wedge-shaped body portion is exposed through the resist film; and removing the passivation film from the exposed tip portion of the wedge-shaped body portion.

7. The method of claim 6, wherein the passivation film is removed from the exposed tip portion of the wedge-shaped body portion by a wet etching process.

8. The method of claim 4, wherein the step of forming a recess in a surface of a semiconductor crystal layer comprises:

forming a first high-resistance wide-band gap layer of AlGaAs on a channel layer of InGaAs;

forming a low-resistance contact layer of GaAs on the first high-resistance wide-band gap layer of AlGaAs; and selectively etching the low-resistance contact layer of GaAs to define a recess that divides the low-resistance contact layer of GaAs.

9. The method of claim 8, further comprising:

forming a second high-resistance wide-band gap layer of AlGaAs on a buffer layer; and forming the channel layer of InGaAs on the second wide-band gap layer of AlGaAs.

10. The method of claim 9, wherein the charmel layer has a thickness in the range of from 50 Å to 150 Å.

11. The method of claim 8, wherein the low-resistance contact layer of GaAs is selectively etched using an etching solution comprising a mixture of ammonia water and hydrogen peroxide water mixed at a ratio of 1 to 4000 or more and diluted by water.

12. The method of claim 4, wherein the step of forming a recess in a surface of a semiconductor crystal layer comprises:

forming a high-resistance wide-band gap layer of AlGaAs on a channel layer of InGaAs;

forming a low-resistance wide-band gap layer of AlGaAs on the high-resistance wide-band gap layer of AlGaAs;

forming a low-resistance contact layer of GaAs on the low-resistance wide-band gap layer of AlGaAs; and selectively etching the low-resistance contact layer of GaAs to define a recess that divides the low-resistance contact layer of GaAs.

13. The method of claim 12, wherein the low-resistance wide-band gap layer has a thickness ranging from 40 Å to 120 Å.

14. A method of manufacturing a high electron mobility transistor, comprising the steps of:

forming a high-resistance wide-band gap layer of AlGaAs on a channel layer of InGaAs;

forming a low-resistance contact layer of GaAs on said high-resistance wide-band gap layer of AlGaAs;

selectively etching said low-resistance contact layer of GaAs to define a recess which divides said low-resistance contact layer of GaAs;

forming a wedge-shaped body portion of a gate electrode extending vertically from a bottom of said recess by way of vacuum evaporation in said recess through an opening defined in a resist;

forming a passivation film on an inner wall surface of said recess and a lower portion of said wedge-shaped gate electrode; and thereafter forming an enlarged head portion on said wedge-shaped body portion by way of vacuum evaporation through an opening defined in a resist to provide a gate electrode of a T-shaped cross section.

15. A method according to claim 14, wherein said low-resistance contact layer of GaAs is selectively etched using an etching solution comprising a mixture of ammonia water and hydrogen peroxide water mixed at a ratio of 1 to 4000 or more and diluted by water.

* * * * *

UNITED STATES PATENT AND TRADEMARK OFFICE
CERTIFICATE OF CORRECTION

PATENT NO. : 6,294,446 B1
DATED : September 25, 2001
INVENTOR(S) : Ishikawa

It is certified that error appears in the above-identified patent and that said Letters Patent is hereby corrected as shown below:

Title page, Item [54] and Column 1, lines 2 and 3,
Please delete "WITH A T-SHAPED GATE ELECTRODE".
Item [57], please delete -- tact --.

Column 1,
Line 20, before "(aluminum gallium arsenide)", please add -- InGaAs --.
Line 44, please delete "(".
Line 52, please change "Åto" to -- Å to --.

Column 2,
Line 10, please change "layer 365" to -- layer 36 --.
Line 67, please change "frecluency" to -- frequency --.

Column 3,
Line 3, please change "radiofrequency" to -- radio-frequency --.
Line 22, please change "geap" to -- gap --.
Line 52, please change "Layer" to -- layer --.
Line 56, please change "intention" to -- invention --.

Column 4,
Line 41, please change "wide-bend" to -- wide-band --.
Line 54, please change "layer 265" to -- layer 26 --.

Column 5,
Line 61, please change "is. low," to -- is low, --.
Line 66, please change "idmmediately" to -- immediately --.

Column 6,
Line 9, please change "v oltage" to -- voltage -- and "gat e" to -- gate --.
Line 22, please change "andlan" to -- and a --.
Line 44, please delete "(".

Column 7,
Line 2, please change "wide-bancd" to -- wide-band --.
Line 9, please change "cross-.sectional" to -- cross-sectional --.
Line 38, please change "H$_2$0" to -- H$_2$O --.

UNITED STATES PATENT AND TRADEMARK OFFICE
CERTIFICATE OF CORRECTION

PATENT NO. : 6,294,446 B1
DATED : September 25, 2001
INVENTOR(S) : Ishikawa

It is certified that error appears in the above-identified patent and that said Letters Patent is hereby corrected as shown below:

<u>Column 8,</u>
Line 22, please change "portien" to -- portion --.
Lines 42 and 43, please change "wedt, e-shaped" to -- wedge-shaped --.

<u>Column 9,</u>
Line 15, please change "charmel" to -- channel --.

Signed and Sealed this

Third Day of December, 2002

JAMES E. ROGAN
*Director of the United States Patent and Trademark Office*